United States Patent
Meir et al.

(10) Patent No.: US 7,613,232 B2
(45) Date of Patent: Nov. 3, 2009

(54) METHOD FOR AUTOMATIC CONTROL OF RF OUTPUT LEVEL OF A REPEATER

(75) Inventors: Amir Meir, Tel Aviv (IL); Alexander Baber, Ramat Gan (IL); Yaniv Avital, Modiin (IL)

(73) Assignee: Axel Wireless Ltd., Bucks (GB)

( * ) Notice: Subject to any disclaimer, the term of this patent is extended or adjusted under 35 U.S.C. 154(b) by 0 days.

(21) Appl. No.: 10/562,808

(22) PCT Filed: Jun. 30, 2004

(86) PCT No.: PCT/IL2004/000582

§ 371 (c)(1),
(2), (4) Date: Dec. 29, 2005

(87) PCT Pub. No.: WO2005/002109

PCT Pub. Date: Jan. 6, 2005

(65) Prior Publication Data

US 2007/0071128 A1    Mar. 29, 2007

Related U.S. Application Data

(60) Provisional application No. 60/483,177, filed on Jun. 30, 2003.

(51) Int. Cl.
*H04L 25/20* (2006.01)
*H04L 25/03* (2006.01)
*H04B 7/185* (2006.01)
*H04B 7/15* (2006.01)

(52) U.S. Cl. .................. 375/211; 375/297; 370/318; 455/11.1; 455/127.2

(58) Field of Classification Search .................. 375/211, 375/213, 219, 221, 296, 297, 316, 318, 345; 370/310, 315, 318; 455/11.1, 522, 13.4, 455/69, 127.1, 127.2, 232.1, 234.1, 234.2
See application file for complete search history.

(56) References Cited

U.S. PATENT DOCUMENTS 5,862,460 A * 1/1999 Rich ........................... 455/116
6,055,431 A * 4/2000 Dybdal ........................ 455/450

(Continued)

FOREIGN PATENT DOCUMENTS

WO    WO 97/24884    7/1997
WO    WO00/77941    12/2000

*Primary Examiner*—Young T. Tse
(74) *Attorney, Agent, or Firm*—EMPK & Shiloh, LLP

(57) ABSTRACT

A method and apparatus for controlling an output power level of a radio frequency (RF) repeater (100 or 200). A system includes a receiver to receive a signal, a filtering unit configured to pass frequency components at or around a frequency band of a predetermined communication channel, an attenuator (124 or 142) to produce an attenuated signal by attenuating a parameter of the signal, a power amplifier (150) to adjust the output power level of repeater to a desired level by adjusting the gain of one or more components of the system, and a microprocessor (170) to receive an input responsive to the output power level of the repeater and, in response to the input, to transfer control signals to the receiver and the attenuator. The method includes sampling traffic load characteristics during operation of a network and adjusting a gain of one or more components of the repeater based on the traffic load characteristics.

24 Claims, 4 Drawing Sheets

U.S. PATENT DOCUMENTS

| | | |
|---|---|---|
| 6,259,682 B1 | 7/2001 | Brown et al. |
| 6,374,119 B1 | 4/2002 | Jun et al. |
| 2002/0045431 A1 | 4/2002 | Bongfeldt |
| 2003/0211828 A1* | 11/2003 | Dalgleish et al. ............ 455/11.1 |
| 2006/0003793 A1* | 1/2006 | Ngai et al. .................. 455/522 |

* cited by examiner

METHOD FOR AUTOMATIC CONTROL OF RF OUTPUT LEVEL OF A REPEATER

CROSS REFERENCE TO RELATED APPLICATIONS

This application is National Phase Application of PCT International Application No. PCT/IL2004/000582, filed on International Filing Date Jun. 30, 2004, which claims priority and benefit of U.S. provisional patent application Ser. No. 60/483,177, filed Jun. 30, 2003, which is hereby incorporated by reference in its entirety.

FIELD OF THE INVENTION

The present invention relates generally to repeaters and particularly to a method for automatic control of RF output level in repeaters.

BACKGROUND OF THE INVENTION

Load sharing in conventional cellular spread spectrum type network systems, such as Code Division Multiple Access (CDMA), may involve load management at base stations (BTSs) of a cellular system. Load sharing may be helpful in reducing imbalances and other problems resulting from the dynamic nature of the network activity, for example, the effect of a continually changing number of communicating mobile devices, e.g., cell phones, and the transmitted power of the communicating devices. Networks that are susceptible to changing loads may suffer from a phenomenon known as "Adjacent Code Interference", which may be handled by a power-control scheme aimed at maintaining the total power received from all mobile devices within a given cell at a generally constant level.

An additional phenomenon in the operation of a cellular spread spectrum type system, such as CDMA, is known as "adjacent cell soft-handoff". This phenomenon relates to a procedure in which two base stations, one in the cell site where the mobile device is located and the other in the cell site to which the conversation is being transferred, are both connected to the call until a required transfer protocol is completed, at which time the call may be disassociated from the original base station. The original base station may not cut off the conversation until receiving a confirmation that the new base station at the new location has obtained control of the call.

The above described phenomena may result in a further phenomenon, known as "Cell Breathing", which relates to the periodic expansion and contraction of cell coverage and, consequently, of the effective geographical area covered by a certain base station. Thus the cell size may continually change in response to the amount of traffic using the cell. For example, when a cell becomes extremely loaded, the cell may "shrink", causing some of its subscriber traffic to be redirected to a neighboring cell, which may be less loaded, thereby balancing the load among cells.

Cell breathing may be encountered in 2G and 2.5G technology, and is likely to become more critical for the advanced 3G cellular systems, such as CDMA UMTS and CDMA2000, where a very high Quality of Service (QoS) to the end-user will be required to efficiently handle the types of data services introduced by such advanced systems. Also, more significant extremes between "light" and "heavy" traffic are to be expected in 3G systems, due to an inherently larger data transmission capacity.

In a multi-cell environment, the uplink capacity of a spread spectrum type network system, such as a CDMA system, may be determined by the bit energy-to-noise density ratio, $E_b/N_o$, where $E_b$ is the energy of one bit of information and $N_o$ is the total spectral noise power density, which includes both the background thermal noise and the co-channel interference caused by mobile devices in the same cell and adjacent cells.

The $E_b/N_o$ system parameter typically determines the quality of the signal, e.g., a certain minimum $E_b/N_o$ may be required for adequate system performance. It can be shown that as the number of mobile devices (n) increases, $E_b/N_o$, of the system decreases. Therefore, there may be a maximum number of mobile devices, $n=n_{max}$, for which $E_b/N_o$ reaches its minimum value, below which value satisfactory performance of the receiver and its decoding process may not be possible.

When the number of users in the cell approaches $n_{max}$, the cell typically reaches its physical capacity limit. If this heavily loaded cell can share its load with neighboring cells by off-loading some of the users to some less heavily loaded neighboring cells, then more users may be simultaneously active within the system as a whole. Overlapping areas are important for mobile devices near the cell boundaries, where soft-handoff and counteractive fluctuations of the received signal power may be induced.

One known way to achieve load sharing is to handoff some of the users in the overlapping regions of heavily loaded cells to less loaded neighboring cells. In terms of measurable energy of radio transmission originating from the base station, the overall temporal sum of energy in a given location within the range of a particular cell increases with traffic build up. The result is that the cell "shrinking" is inversely proportional to the measured intensity.

The role of a repeater (also known as cell-extender) in a cellular network, such as CDMA, is typically to serve as an uplink/downlink signal enhancer, amplifying the received signals by a predefined gain factor. It is therefore important for proper cellular network operation that the repeater will not modify the received signals nor compress their dynamic range so as not to affect the "cell-breathing" phenomenon.

It is known that a repeater may function optimally when it is as transparent to the network as possible. A barrier to this functionality requirement may be the requirement of setting an upper limit to the downlink transmitted power. This need may be derived from environmental considerations and neighboring cell interference issues (e.g., RF coverage design) that may demand optimal power levels.

As explained above, the intensity of the RF signal at a location of a given repeater typically increases proportionally to the number of actively connected mobile devices at a given time. For this reason, a repeater that is set to amplify the uplink/downlink signals by a given gain factor, may reach or even exceed its preset power limit, occasionally reaching a range where undesired effects of nonlinear amplifiers become significant. A conventional procedure for controlling the transmitted power, known as Automatic Level Control (ALC), involves a process of automatically reducing the repeater gain when the transmit power reaches a predefined level.

Reference is now made to FIG. 1, which is a schematic graph of exemplary traffic in a conventional cellular cell as a function of the maximum permitted power output. It can be seen that the ALC process typically leads to signal compression, meaning that as the traffic in a cell drives the repeater to the plateau of the ALC, the repeater output becomes substantially constant and is no longer sensitive to changes in the repeater input power levels. If the repeater output can be prevented from reaching its non-linear saturation area, the transmit fluctuations in the repeater's input port may not be properly reflected, preventing the base station and individual mobile devices from properly operating their power control mechanisms. For example, depending on attenuation and interference, the base station may transmit control messages to the mobile devices in order to determine and set a minimum power level that meets a preset quality target. This may reduce interference with other users and may increase battery lifetime.

An additional drawback of the conventional ALC is its tendency to disturb the uplink/downlink gain balance, which is important in order for the base stations to control their associated mobile devices, e.g., to ensure that transmissions from the associated stations are received by the base stations at a similar power level, thereby preserving a generally stable $E_b/N_o$ ratio for all users. Since the ALC typically operates on the downlink, the downlink/uplink gain balance; may be disrupted. This disruption may result in a reduced base-station dynamic range, reduced coverage area and over-all improper network operation due to cell breathing interruption.

SUMMARY OF THE INVENTION

There is thus provided in accordance with embodiments of the present invention a method for controlling radio frequency (RF) output level of a repeater, the method including sampling traffic load characteristics during operation of a network and adjusting a gain of at least one component of the repeater based on the traffic load characteristics.

There is further provided in accordance with embodiments of the present invention an apparatus to amplify the power of a RF signal, the apparatus including an attenuator to produce an attenuated signal by attenuating a parameter of an input signal, a power amplifier to produce an output signal by amplifying the attenuated signal, a power monitor to monitor the power level of the output signal, and a RF gain controller able to adjust the output power by controlling the attenuation of the input signal, e.g., by controlling said attenuator, based on traffic load characteristics sampled during operation of a network.

There is further provided in accordance with embodiments of the present invention a system for adjusting a radio frequency (RF) output level, the system including a receiver to receive a signal, a filtering unit configured to pass frequency components at or around the communication channel's frequency band, an attenuator to produce an attenuated signal by attenuating a parameter of the signal, a power amplifier unit to adjust the power of the RF output level to a desired level of a gain of at least one component of the system, and a microprocessor unit to receive signals of the power of the RF output level and to transfer control signals to the receiver and the attenuator.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
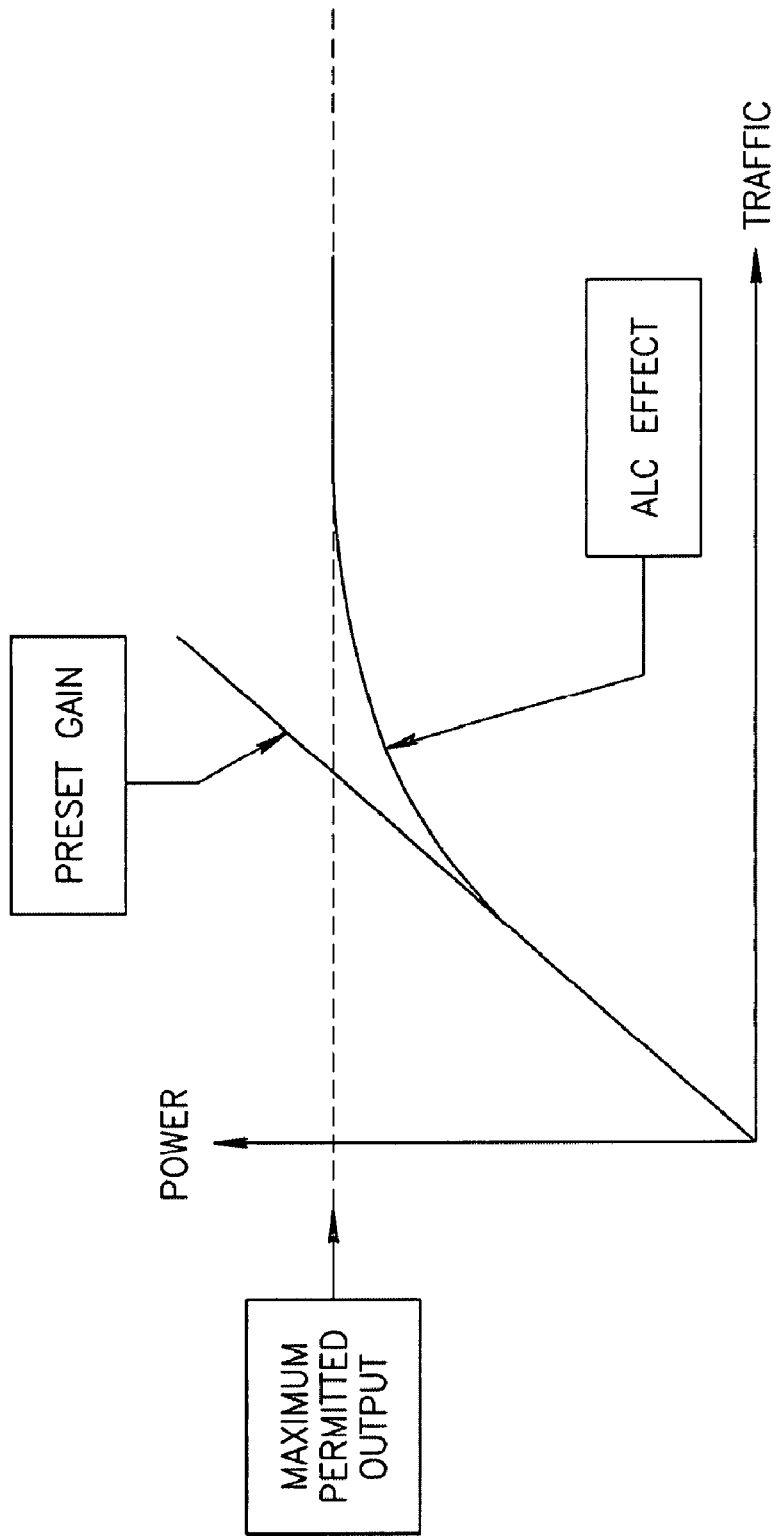
FIG. 1 is a schematic illustration of a graph showing exemplary traffic in a cellular cell as a function of the maximum permitted power output in conventional systems.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EXEMPLARY EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it should be understood that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Although the scope of the present invention is not limited in this respect, the method, system and device for the automatic control of radio frequency (RF) output level of a repeater disclosed herein may be implemented in any suitable type or category of repeaters. By way of example, the method, system and device disclosed herein may be implemented in digital repeaters. Alternatively, according to other embodiments of the present invention, the system and method disclosed herein may be implemented in analog repeaters.

According to some embodiments of the present invention, a RF gain controller, incorporated to a RF repeater, may gradually learn traffic load characteristics of a network and adjust the gain of the repeater according to actual levels of traffic that may be sampled during the operation of the network and following the changing paths of the actual levels of traffic.

In accordance with some embodiments of the present invention, the traffic load characteristics of the network may be sampled in more than one way. For example, the actual levels of the traffic of the network may be sampled repeatedly according to a predetermined scheme. Alternatively, the sampling of the traffic load characteristics of the network may be performed automatically at predetermined time intervals. In another example, the sample of the traffic load characteristics of the network may be done upon request. The traffic load characteristics of the network may be sampled in or by one or more components within the RF repeater, as discussed in detail below.

According to some embodiments of the present invention, the automatic setting and calibration of the RF repeater with the RF gain controller may eliminate the need for special settings and calibration during the installation or initial setup of the repeater. Obviating the need for such settings and calibration may be advantageous because it obviates the need for an experienced technician and analysis equipment required in setting up conventional systems. For example, the automatic setting/calibration may obviate the need for initial settings at maximal traffic load conditions and/or the need for repeated on-site visits by a technician for the purpose of periodic gain adjustment.

Figure 2A:
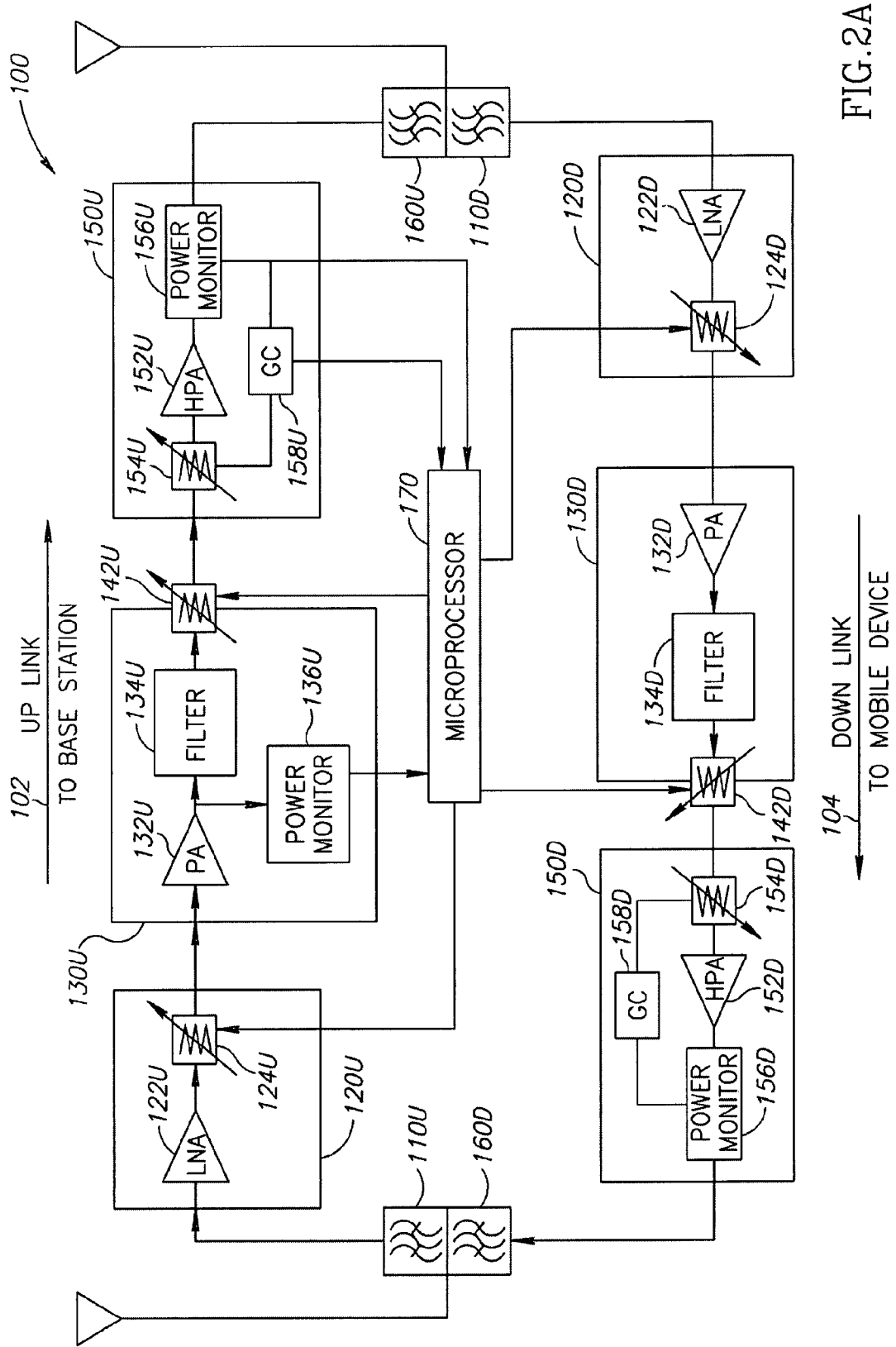
FIG. 2A is a block diagram of a bi-directional repeater with a RF gain controller according to some exemplary embodiments of the present invention.

Reference is made to FIG. 2A, which schematically illustrates a block diagram of a bi-directional repeater 100 with a RF gain controller according to exemplary embodiments of the present invention. The bi-directional repeater 100 may include two more sections, namely: an up-link section 102, which receives signals from a mobile device, e.g., a cell phone, and retransmits the signal to a base-station; and a down-link section 104 which receives from a base-station data-bearing signals and retransmits the signal to a mobile device corresponding signals carrying the data.

Looking first at the up-link section 102 from left to right in FIG. 2A, section 102 may include an input filter 110U, which may be, for example, a radio frequency ("RF") filter, or more specifically, may be a filter tuned to pass frequencies in a predetermined frequency range, e.g., in the range of 800 to 830 MHz, although the invention is not limited in this respect. The input RF filter 110U may receive signals from an antenna, filter the frequencies outside the predefined pass range, and provide a signal representing the filter pass-range signal to a pre-filtering unit 120U, which may include a low noise amplifier ("LNA") 122U and an attenuator 124U, for example, a LNA and attenuator as are known in the art. The pre-filtering unit 120U may mix a received signal with periodic signal, e.g., a sinusoidal signal, for example, a sine or cosine wave signal of a given frequency, such that the received signal is down-converted to an intermediate frequency ("IF"). The given frequency mixed with the received signal may be determined and controlled, for example, by microprocessor 170, as described in detail below. The IF output of the pre-filtering unit 120U may enter a RF filtering unit 134U. RF filtering unit 130U may include, for example, a pre-amplifier unit 132U and a filter unit 134U. Optionally, in some exemplary embodiments of the present invention, RF filtering unit 130U may include a power monitor 136U, for example, to sample actual levels of communication traffic and provide traffic level samples to microprocessor 170. The filter unit 134U may be, for example, a Surface Acoustic Wave (SAW) filter or a ceramic filter, as is known in the art, or a digital filter, such as, for example, the digital filter described in U.S. Pat. No. 6,873,823, assigned to the same assignee as the present invention, the disclosure of which is incorporated herein by reference in its entirety.

The filtered output of the RF filtering unit 130U may be received by an attenuator 142U, which may attenuate the filtered signal according to the control signal received from microprocessor 170, as described in detail below. An adjustable power amplifier unit 150U, which may include an attenuator 154U, a high-power amplifier 152U ("HPA"), and a power monitor 156U, may be used to adjustably amplify the attenuated signal from attenuator 142U to produce an output signal having a desired power level. A RF gain controller circuit 158U ("GC") may adjust the attenuation provided by attenuator 154U, as described in detail below. The output signal from power amplifier block 150U may propagate to and through a duplexer including an output filter 160U. Output filter 160U may be, for example, a radio frequency ("RF") filter, or more specifically, may be a filter tuned to pass the output signal to frequencies in the predetermined frequency range, e.g., in the range of 800 to 830 MHz in the example mentioned above, although the invention is not limited in this respect.

As discussed above, the traffic load characteristics of the network may be sampled in or by one or more components within the RF repeater 100. For example, in the up-link section 102, the samples of the traffic load characteristics may be produced by or in one or more components of up-link section 102, e.g., by input filter 110U, pre-filtering unit 120U, RF filtering unit 130U, or power amplifier unit 150U, or by any suitable combination of such components. The samples may be received by microprocessor 170, which may analyze the samples in accordance with a predetermined scheme. Based on this analysis, microprocessor 170 may then send control signals to attenuator 124U and/or to attenuator 142U. Based on these control signals, one or more of the attenuators may attenuate the signal power to the requested level, for example, according to the predetermined scheme.

According to the predetermined scheme, in response to the received samples, microprocessor 170 may send control signals to attenuator 124U and/or to attenuator 142U, to reduce or increase the gain of the downlink and/or uplink channels. Following any change in the gain, microprocessor 170 may send additional control signals to attenuator 124U and/or to attenuator 142U until the new gain is adopted. Microprocessor may stop sending the additional control signals when the desired gain and the gain of the network are matched. The described predetermined scheme may allow an installer of the bi-directional repeater to design the installation of the bi-directional repeater 100 with a smaller margin over the gain compared to other repeaters known in the art.

In accordance with some embodiments of the present invention, by virtue of RF gain controller circuit 158U and microprocessor 170, bi-directional repeater 100 may be operated to sustain a pre-defined, desired, e.g., maximum or optimal, output power level, which may be related to the traffic in a given cell. According to embodiments of the present invention, the RF gain controller circuit 158U and microprocessor 170 may modify the power level according to a predefined timing scheme, e.g., periodically or at predefined points in time, for example, depending on the downlink output signal power, which may follow the existing traffic in a specific cell.

In accordance with some embodiments of the present invention, microprocessor 170 may sample the actual levels of traffic to modify the predefined level depending on the downlink output signal power. For example, microprocessor 170 may receive samples of the actual levels of the traffic from RF gain controller circuit 158U, power monitor 156U and/or power monitor 136U repeatedly according to a predetermined scheme. Alternatively, RF gain controller circuit 158U, power monitor 156U, and/or power monitor 136U may sample the actual levels of the traffic automatically at predetermined time intervals and transfer the samples to microprocessor 170.

This is in contrast to conventional repeaters that may keep the gain at predefined levels for low power signals and may decrease the gain as an input signal reaches an "put of operation" region, thereby being forced to restore their previous gain when the input signal reaches the "out of operation" region.

As a result, following the point of modifying the predefined level, the microprocessor 170 and RF gain controller unit 158U may sustain the gain of RF repeater 100 at a level that may match a maximum power downlink input signal, regardless of transient effects, for example, temporary, e.g., traffic driven, transients and cell breathing effects that may appear at the input signal.

As further shown in FIG. 2A, the down-link section 104 of bi-directional repeater 100 may virtually mirror the up-link section 102 discussed above. A difference between the up-link and down-link sections may be in that down-link section 104 may include an input RF filter 110D, a pre-filtering unit 120D, a RF filtering unit 130D, an attenuator 142D, a power amplifier unit 150D, and an output RF filter 160D, which may be tuned or adjusted to receive and pass frequencies of downlink communication channels, as opposed to passing frequencies at or around uplink communication channels, as discussed above with reference to uplink section 102.

The traffic load characteristics of the network may be sampled in or by one or more components within the downlink section 104. In some embodiments, the samples of the traffic load characteristics may be produced in or by one or more components of downlink section 104, for example, in input RF filter 110D, in RF filtering unit 130D, or in output RF filter 160D. The samples may be received by microprocessor 170, which may analyze the samples in accordance with a predetermined scheme. Based on this analysis, microprocessor 170 may then send control signals to attenuators 124D and/or attenuator 142D, to thereby attenuate the signal to the desired level, for example, according to the predetermined scheme as described above in detail.

Figure 2B:
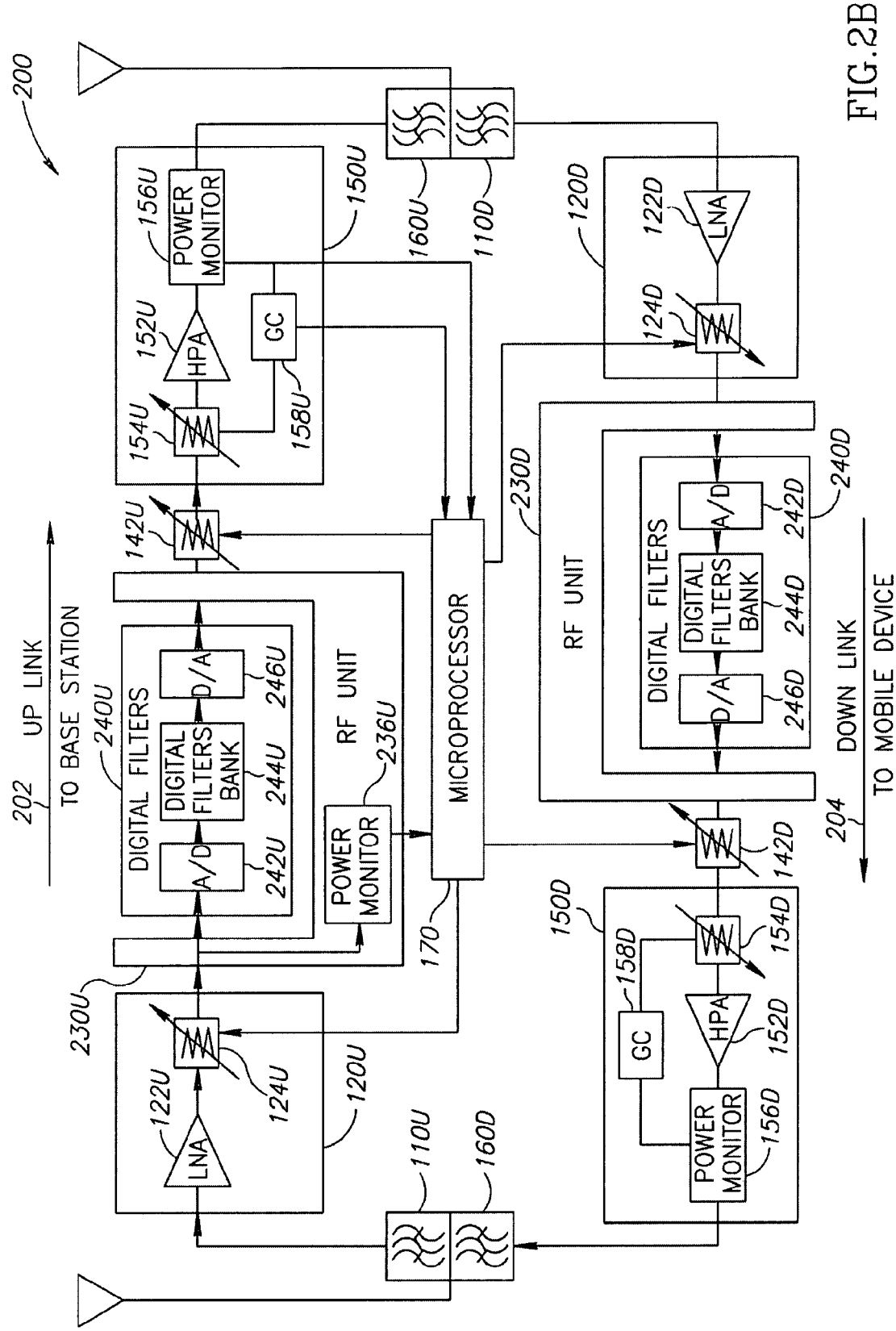
FIG. 2B is a block diagram of a bi-directional repeater with a RF gain controller according to further exemplary embodiments of the present invention.

Reference is now made to FIG. 2B, which is a block diagram of a bi-directional repeater 200 with a RF gain controller according to further exemplary embodiments of the present invention. Components of the repeater of FIG. 2B that are similar or identical to corresponding components of repeater 100 in FIG. 2A are generally designated using the same reference labels and, for the sake of brevity, the description relating to such elements is generally not repeated. An up-link section 202 of bi-directional repeater 200 in FIG. 2B includes a RF unit, 230U, which may optionally include, in some exemplary embodiments of the invention, a power monitor 236U, for example, to sample actual levels of traffic and to provide microprocessor 170 with such traffic level samples. RF unit 230U may further down convert the IF signal to digital filter 240U and may also convert the down-converted signal to a digital form using an A/D converter 242U which may be an internal component of digital filter 240U, e.g., as is known in the art. The optional A/D converter 242U may sample the IF signal and may generate a digital signal representing the sampled IF signal. The digital signal representing the IF signal may enter a digital filter bank 244U, which may include a digital filter bank as described in U.S. Pat. No. 6,873,823, assigned to the same assignee as the present invention, the disclosure of which is incorporated herein by reference in its entirety. In accordance with an exemplary embodiment of the present invention, a SAW filter (not shown) may replace A/D converter 242U, digital filter bank 244U, and D/A converter 246U, and it may be used to filter the received signal. The filtered output of the digital filter bank 244U may optionally be converted to an analog signal by a D/A converter 246U. The filtered output, in digital form or analog form if it was converted by DIA converter 246U, may be received by an attenuator 142U, which may attenuate the filtered signal according to control signals from microprocessor 170, as described in detail above.

As further shown in FRI 2B, a down-link section 204 of bi-directional repeater 200 may virtually minor the up-link section 202 discussed above. A difference between the up-link and down-link sections may be in that down-link section 204 may include an input RF filter 110D, a pre-filtering unit 120D, a RF unit 230D, a digital filter 240D, an attenuator 142D, a power amplifier unit 150D, and an output RF filter 160D, which may be tuned or adjusted to receive and pass frequencies of downlink communication channels, as opposed to passing frequencies at or around uplink communication channels, as discussed above with reference to uplink section 202.

The traffic load characteristics of the network may be sampled in or by one or more components within the downlink section 204. In some embodiments, the samples of the traffic load characteristics may be produced in or by one or more components of downlink section 204, for example, in input RF filter 110D, in RF unit 130D, or in output RF filter 160D. The samples may be received by microprocessor 170, which may analyze the samples in accordance with a predetermined scheme. Based on this analysis, microprocessor 170 may then send control signals to attenuators 124D and/or attenuator 142D, to thereby attenuate the signal to the desired level, for example, according to the predetermined scheme.

Figure 3:
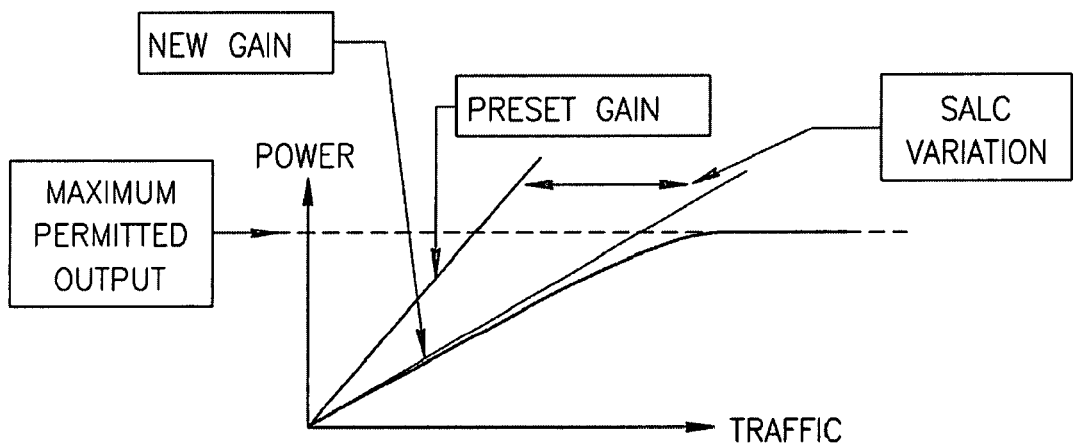
FIG. 3 is a schematic illustration of a graph showing traffic in a cellular cell as a function of the maximum permitted power output, in accordance with some embodiments of the present invention.

Reference is now made to FIG. 3, which is a schematic illustration of a graph showing traffic in a cellular cell as a function of a maximum permitted power output, in accordance with some embodiments of the present invention. Unlike a conventional ALC mechanism, which may result in a signal compression as discussed in detail above, in the present invention, when the gain is changed by RF gain controller unit 158U (shown in FIGS. 2A and 2B) from its initial values to the new values that may match the traffic conditions, the signal may not be compressed. Accordingly, because the gain may be changed according to the traffic load characteristics of the network, there may be a generally linear correlation between the gain of the repeater and the gain of the base station and, therefore, the "cell-breathing" phenomenon may be reduced significantly or eliminated.

Figure 4:
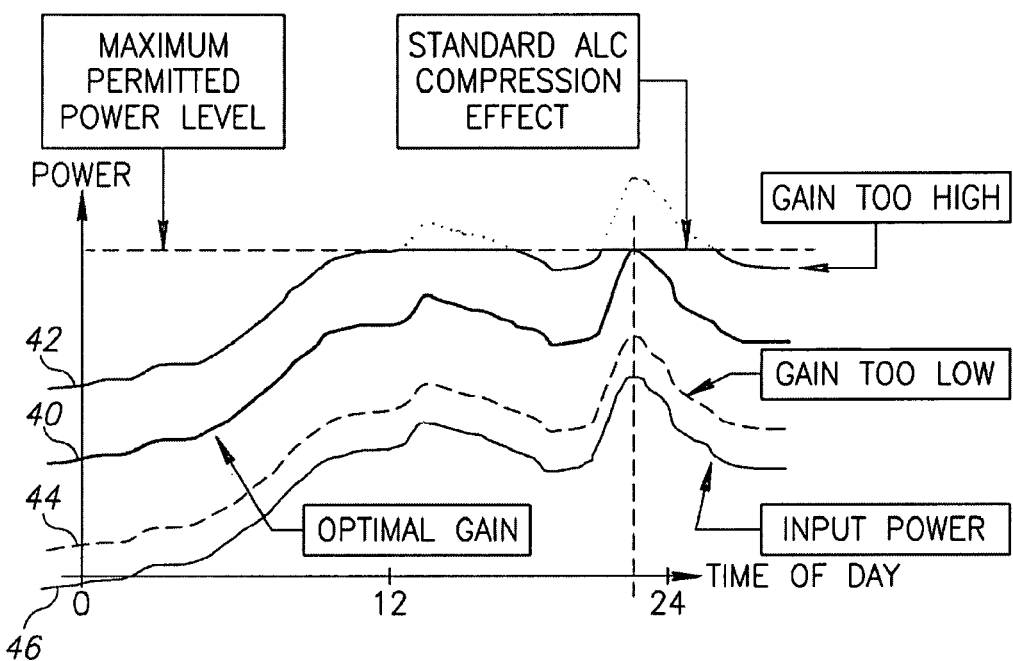
FIG. 4 is a schematic illustration of graphs showing various output signal power levels of a bi-directional RF repeater in accordance with some embodiments of the present invention in response to an input power, and gain levels that are below and above a maximum permitted power level, respectively, as a function of time.

Reference is now made to FIG. 4, which is a schematic illustration of graphs showing various output signal power levels of a bi-directional RF repeater, in accordance with some embodiments of the present invention, in response to an input power, and gain levels that are below and above a maximum permitted power level, respectively, as a function of time. Curves 42 and 44 illustrate exemplary output signal power levels of different repeaters known in the art such as, for example, repeaters of a CDMA network. Curve 44, for example, shows an output signal power below the maximum permitted level, e.g., because the gain factor of the repeater associated with the illustrated output signal may be too low. Curve 42, as a second example, shows an output signal power above the maximum permitted level, e.g., because the gain factor of the repeater associated with the illustrated output signal may be too high. As illustrated by curve 40 in FIG. 4, the output signal power of bi-directional RF repeater 100 (200) may be substantially continuously maintained at values generally linearly proportional to the input signal values, which are illustrated by curve 46. Therefore, the dynamic range of the output signal power may be preserved regardless of the network load and, consequently, the base station may transmit power control signals to the mobile devices and may measure the responses of the mobile devices to such power control signals, thereby maintaining a desired gain balance.

In accordance with some embodiments of the present invention, bi-directional RF repeater 100 (200) with RF gain controller unit 158U may be configured to keep desired, e.g., maximal or optimal, gain factors while enabling the repeater to remain transparent to the network within which it operates, e.g., the network defined by a plurality of base stations and mobile devices.

In accordance with some exemplary embodiments of the present invention, a balance may be preserved between the uplink and downlink functionalities of bi-directional repeater 100 (200). It will be appreciated by persons skilled in the art that, when the uplink and downlink functionalities are not balanced, repeaters, base stations, and mobile devices in the system may transmit at different levels. In this situation, a base station may detect communication signals regenerated by a mobile device, which may includes a repeater as described above, as being transmitted at a higher gain than signals transmitted by other mobile devices associated with the same base station. This bears the risk of reducing the dynamic range of the base station itself. Therefore, in exemplary embodiments of the invention, the bi-directional repeater 100 (200) with RF gain controller circuit 158U has the advantage of being configurable to adjust the uplink and the downlink channels in one operation. This may be achieved, for example, by providing a predefined reference value, e.g., a maximal permitted gain level, to microprocessor 170 and/or to RF gain controller 158U, to be used during the operation of bi-directional repeater 100 (200) and the sampling of the traffic characteristics of the network. Therefore, in this embodiment, microprocessor 170 and/or RF gain controller 158U may modify the output level signal to obtain the desired level, according to the sampled characteristic; however, this desired level may not exceed the predefined reference value, e.g., the maximal permitted gain level, provided to the microprocessor and gain controller.

As a result, the gain in bi-directional repeater 100 (200) may be reduced, and the RF output level transmitted by the repeater may be optimized. For example, the gain in the up-link section 102 (202) of the bi-directional repeater 100 (200) may be reduced to optimize the RF output level transmitted from the down-link section 104 (204). Similarly, the gain in down-link section 104 (204) of bi-directional repeater 100 (200) may be reduced to optimize the RF output level transmitted from up-link section 102 (202).

According to some embodiments of the present invention, microprocessor 170 and RF gain controller unit 158U may be help to prevent oscillations of bi-directional repeater 100 (200). Oscillations may be attributed to improper installation of repeaters and/or insufficient margin of isolation over the gain of the repeaters. Practically, desired isolation may be achieved between a donor and a service antenna, and such isolation may be temporarily lost in response to sudden rise of traffic. According to exemplary embodiments of the invention, oscillations may be prevented by reducing the gain of bi-directional repeater 100 (200) in response to excessive output power, which may be monitored by either or both of power monitor 156U and power monitor 136U (236U). Microprocessor 170 and RF gain controller unit 158U may sense the oscillations and, accordingly, may modify, e.g., reduce or increase the gain of the repeater to adapt to a new gain level that may stop the oscillation conditions. When the oscillation and isolation problem is solved, e.g., once the gain is reduced or increased, depending on the case, bi-directional repeater 100 (200) may increase or reduce its gain, respectively, back to the desired operating level. The proactive increase or decrease of the gain to solve the oscillation/isolation problem may be initiated, for example, at predetermined time intervals and may be executed in accordance with a predetermined gain step scheme, which may be defined by a customer, e.g., according to particular system requirements and/or specifications. However, the subsequent decrease or increase of the gain, respectively, may be done automatically by the system, which may respond to the actual changes in gain due to the proactive gain modification. As a result, the overall network pilot pollution in case of abnormal operation of bi-directional repeater 100 (200), and a related cell shrinking phenomenon, may be minimized or even eliminated.

It will be appreciated by persons skilled in the art that the present invention is not limited by what has been particularly shown and described herein above. For example, although particular repeater structure has been described in the particular method above, it will be understood that other repeater structures and configurations may be employed within the bounds of the invention, and that the invention is not limited in this regard.

The invention claimed is:

1. A method of controlling a radio frequency (RF) output power level of a repeater having a downlink section and an uplink section, wherein the method is performed by at least one section of said downlink and uplink sections, the method comprising:

receiving a RF input signal;

producing an attenuated signal by attenuating a parameter of the received RF input signal;

producing an output signal by amplifying said attenuated signal;

monitoring the power level of said output signal;

sampling, upon request, traffic load characteristics of the received RF input signal during operation of a network associated with the repeater;

based on said sampling, adjusting the monitored power level of said output signal by controlling the gain of said received RF input signal based on the sampled traffic load characteristics; and based on said sampling, sustaining the output monitored power level of said repeater substantially at a desired, predefined, level during operation of said network.

2. The method according to claim 1, wherein said sampling comprises sampling a parameter related to changing paths of actual levels of traffic.

3. The method according to claim 1, wherein said sampling comprises repeatedly sampling said traffic load characteristics according to a predetermined scheme.

4. The method according to claim 1, wherein said sampling comprises automatically sampling said traffic load characteristics at predetermined time intervals.

5. The method according to claim 1, wherein said sampling comprises sampling said traffic load characteristics by one or more components of the downlink section of said repeater.

6. The method according to claim 1, wherein said sampling comprises sampling said traffic load characteristics by one or more components of the uplink section of said repeater.

7. The method according to claim 1, wherein said desired, predefined level relates to an optimal power for said traffic load characteristics.

8. The method according to claim 1, wherein said desired, predefined level relates to a maximal power for said traffic load characteristics.

9. The method according to claim 1, wherein said repeater comprises a digital repeater.

10. The method according to claim 1, wherein said repeater comprises an analog repeater.

11. The method according to claim 1, wherein said adjusting comprises adjusting the gain of one or more components of either or both said downlink section and said uplink section based on an output power level of said uplink section.

12. The method according to claim 1, wherein said adjusting comprises adjusting the gain of one or more components of said uplink section based on a gain of at least one component of said downlink section.

13. The method according to claim 1, further comprising:
monitoring a parameter of one or more components of said repeater to detect an oscillation event; and
if an oscillation event is detected, proactively modifying the gain of one or more components of said repeater according to a predetermined scheme.

14. A repeater comprising a downlink section and an uplink section, wherein at least one section of said downlink and uplink sections comprises:
a receiver to receive a Radio Frequency (RF) input signal;
an attenuator to produce an attenuated signal by attenuating a parameter of the received RF input signal;
a power amplifier to produce an output signal by amplifying said attenuated signal;
a power monitor to monitor the power level of said output signal; and
a RF gain controller to sample, upon request, traffic load characteristics of the received RF input signal during operation of a network associated with the repeater, to adjust the monitored power level of said output signal by controlling the gain of said received RF input signal by said attenuator based on the sampled traffic load characteristics, and to sustain the output monitored power level of said repeater substantially at a desired, pre-defined, level during operation of said network.

15. The repeater according to claim 14, wherein said RF gain controller is adapted to repeatedly sample said traffic load characteristics.

16. The repeater according to claim 14, wherein said RF gain controller is adapted to automatically sample said traffic load characteristics at predetermined time intervals.

17. The repeater according to claim 14, wherein said RF gain controller is adapted to sustain a substantially predefined output power level of one or more devices communicating in said network during the operation of said network.

18. A system for adjusting a radio frequency (RF) output power level of a repeater, wherein the repeater comprises a downlink section and an uplink section, wherein the system is comprised in a section selected from said downlink and uplink sections, the system comprising:

a receiver to receive a RF input signal;
a filtering unit operably associated with said receiver, configured to pass frequency components of the RF input signal at or around a frequency band of a predefined communication channel;
an attenuator operably associated with said receiver, to produce an attenuated signal by attenuating a parameter of said RF input signal;
a power amplifier unit operably associated with said receiver, to sample traffic load characteristics of the RF input signal during operation of a network associated with the repeater, and to adjust the RF output power level of said repeater to a desired level by adjusting a gain of one or more components of said system based on the sampled traffic load characteristics during operation of the network; and
a microprocessor to receive an input responsive to said RF output power level and, based on said input, to provide adjustment control signals to said receiver and said attenuator, and to sustain the RF output power level of said repeater substantially at a desired, predefined, level during operation of said network.

19. The system according to claim 18, wherein either or both of said receiver and said attenuator are able to adjust the RF input signal received by said receiver to a desired input level based on said adjustment control signals.

20. The system according to claim 18, wherein either or both of said receiver and said attenuator are able to adjust a parameter of the frequency components passed by said filtering unit based on said adjustment control signals.

21. The system according to claim 18, wherein said power amplifier unit comprises:
an additional attenuator operably associated with said receiver, to reduce the amplitude of said RF input signal;
a high-power amplifier operably associated with said receiver, to increase the power of said RF input signal;
a power monitor to monitor said RF output power level of said repeater; and
a RF gain controller circuit able to adjust said additional attenuator to reduce the amplitude of said RF input signal according to multiple samples of said traffic load characteristics sampled during operation of said network.

22. The system according to claim 18, wherein said filtering unit comprises:
an analog to digital converter to generate a digital signal correlated to the received RF input signal;
a digital filter to receive said digital signal from said analog to digital converter, to pass frequency components at or around the frequency band of said communication channel, and to exclude frequency components indicative of interference signals correlated to the digital signal; and
a digital to analog converter to generate an analog signal correlated to the filtered digital signal.

23. The system according to claim 18, wherein said microprocessor is able to monitor oscillations of the system and, upon detecting an oscillation event, to cause one or more components of the system to modify the gain of one or more components of the system according to a predetermined scheme.

24. The system according to claim 23, wherein said microprocessor is able to modify the gain of said one or more components of said system by sending to said one or more components control signals responsive to a desired modification according to said predetermined scheme.

* * * * *